United States Patent
Chui et al.

(10) Patent No.: US 7,238,581 B2
(45) Date of Patent: Jul. 3, 2007

(54) METHOD OF MANUFACTURING A SEMICONDUCTOR DEVICE WITH A STRAINED CHANNEL

(75) Inventors: King Jien Chui, Singapore (SG); Ganesh Samudra, Singapore (IN); Yee Chia Yeo, Singapore (SG); Jinping Liu, Singapore (CN); Kheng Chok Tee, Christchurch (NZ); Wee Hong Phua, Singapore (SG); Lydia Wong, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 297 days.

(21) Appl. No.: 11/016,023

(22) Filed: Dec. 16, 2004

(65) Prior Publication Data

US 2006/0030094 A1 Feb. 9, 2006

Related U.S. Application Data

(60) Provisional application No. 60/599,650, filed on Aug. 5, 2004.

(51) Int. Cl.
*H01L 21/336* (2006.01)

(52) U.S. Cl. .............................. 438/301; 257/E21.615
(58) Field of Classification Search ................ 438/142, 438/197, 198–200, 300–308, 931, 933; 257/E21.426, 257/E21.615
See application file for complete search history.

(56) References Cited

U.S. PATENT DOCUMENTS

| 4,835,112 | A  | * | 5/1989  | Pfiester et al. ............... 438/305 |
| 6,326,667 | B1 |   | 12/2001 | Sugiyama et al. |
| 6,621,131 | B2 |   | 9/2003  | Murthy et al. |
| 6,977,400 | B2 | * | 12/2005 | Puchner et al. ............. 257/213 |

* cited by examiner

*Primary Examiner*—Brook Kebede
(74) *Attorney, Agent, or Firm*—Mikio Ishimaru

(57) ABSTRACT

A method of manufacturing a semiconductor device provides a semiconductor substrate with a gate and a number of source/drain regions on the semiconductor substrate. A layer containing a strain-inducing element is provided over the number of source/drain regions. The strain-inducing element is driven from the layer containing a strain-inducing element into the number of source/drain regions. A number of source/drains is formed in the number of source/drain regions.

20 Claims, 8 Drawing Sheets

METHOD OF MANUFACTURING A SEMICONDUCTOR DEVICE WITH A STRAINED CHANNEL

CROSS-REFERENCE TO RELATED APPLICATION(S)

This application claims the benefit of U.S. Provisional Patent Application Ser. No. 60/599,650 filed Aug. 5, 2004, and the subject matter thereof is hereby incorporated herein by reference thereto.

TECHNICAL FIELD

The present invention relates generally to manufacturing semiconductors, and more particularly to manufacturing semiconductors having a strained channel.

BACKGROUND ART

Electronic products are used in almost every aspect of life, and the heart of these electronic products is the semiconductor, or integrated circuit. Semiconductor devices are used in everything from airplanes and televisions to wristwatches.

Semiconductor devices are made in and on wafers by extremely complex systems that require the coordination of hundreds or even thousands of precisely controlled processes to produce a finished semiconductor wafer. Each finished semiconductor wafer has hundreds to tens of thousands of semiconductor dies, each worth as much as hundreds or thousands of dollars.

Semiconductor dies are made up of hundreds to billions of individual components. One common component is the transistor. The most common and important semiconductor technology presently used is silicon-based, and the most preferred silicon-based semiconductor technology is a Complementary Metal Oxide Semiconductor (CMOS) technology.

The principal elements of CMOS technology generally consist of a silicon substrate having trench isolation regions surrounding n-channel or p-channel transistor areas. The transistor areas contain polysilicon gates on a silicon oxide dielectric, or gate oxides, over the silicon substrate. The silicon substrate adjacently opposite the polysilicon gate is doped to become conductive. The doped regions of the silicon substrate are referred to as "shallow source/drain regions," or "source/drain extension regions" which are separated by a channel region in the substrate beneath the polysilicon gate. An oxide or nitride spacer, referred to as a "sidewall spacer," on the sides of the polysilicon gate allows deposition of additional doping to form more heavily doped regions of the shallow source/drain regions, which are called "deep source/drain regions." The shallow and deep source/drain regions are collectively referred to as source/drain regions.

To complete the transistor, a dielectric layer is deposited to cover the polysilicon gate, the spacer, and the silicon substrate. To provide electrical contacts for the transistor, openings are etched in the dielectric layer to the polysilicon gate and the source/drain regions. The openings are filled with metal to form electrical contacts. To complete the integrated circuits, the contacts are connected to additional levels of wiring in additional levels of dielectric material to the outside of the dielectric material.

In operation, an input signal to the gate contact to the polysilicon gate controls the flow of electric current from one source/drain contact through one source/drain region through the channel to the other source/drain region and to the other source/drain contact.

Metal oxide semiconductor field effect transistor (MOSFET) devices are well known and widely used in the electronics industry. The carrier mobility of a MOSFET device is an important parameter because of its direct influence on the drive current and switching performance. In standard MOSFET technology, the channel length and gate dielectric thickness are reduced to improve current drive and switching performance. However, reducing the gate dielectric thickness can compromise device performance because of the associated increase in gate leakage current.

In has been shown that in p-channel MOSFETs, a buried silicon-germanium channel region under compressive stress enhances hole mobility in the channel region. Accordingly, a higher drive current can be obtained resulting in faster operating MOSFETs.

One existing strained channel silicon semiconductor includes strained silicon (Si) on a relaxed Silicon/Germanium (SiGe) substrate to obtain the stresses needed. However, these devices have the disadvantages of self-heating and a tight thermal budget window. A higher strain also is required for pMOS transistors to obtain enhanced hole mobility.

One proposed solution involves etching a recess in the area of the source/drain regions and depositing SiGe or silicon/germanium/carbon (SiGeC) in the recess to strain the channel of the transistor. This method involves an additional etching step that adds to the cost of manufacturing the devices.

Another proposed solution involves forming germanium (Ge) on an insulator by oxidation of SiGe on an insulating material, such as an oxide. This approach employs Ge as the channel of the transistor. This approach requires an insulating layer that also adds to the cost of manufacturing the devices.

Solutions to these problems have been long sought but prior developments have not taught or suggested any solutions and, thus, solutions to these problems have long eluded those skilled in the art.

DISCLOSURE OF THE INVENTION

The present invention provides a method of manufacturing a semiconductor device having a semiconductor substrate with a gate and a number of source/drain regions on the semiconductor substrate. A layer containing a strain-inducing element is provided over the number of source/drain regions. The strain-inducing element is driven from the layer containing a strain-inducing element into the number of source/drain regions. A number of source/drains are formed in the number of source/drain regions.

The present invention provides a method for manufacturing a strained channel semiconductor device.

The present invention also avoids etching a recess in the area of the source/drain regions and depositing SiGe or silicon/germanium/carbon (SiGeC) in the recess to strain the channel of the transistor thereby eliminating the cost of manufacturing the semiconductors, introduced by the additional Si recess etch step.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known process steps are not disclosed in detail.

Additionally, the drawings showing embodiments of the present invention are semi-diagrammatic and not to scale and, particularly, some of the dimensions are for the clarity of presentation and are shown greatly exaggerated in the FIGs. Generally, the device can be operated in any orientation.

The term "horizontal" as used herein is defined as a plane parallel to the conventional plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Figure 1:
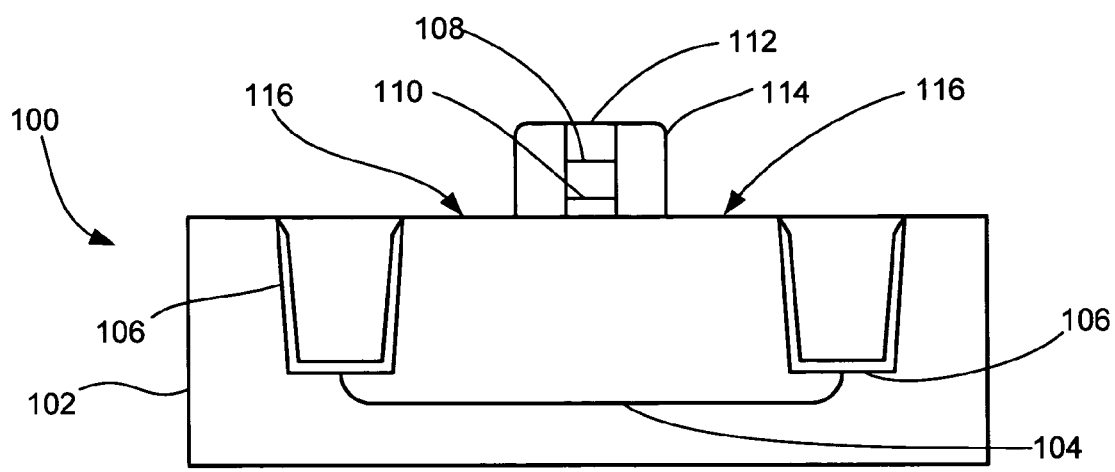
FIG. 1 is a cross sectional view of a semiconductor at an intermediate stage of manufacture in accordance with one embodiment of the present invention.

Referring now to FIG. 1, therein is shown a cross sectional view of a semiconductor device 100 at an intermediate stage of manufacture in accordance with one embodiment of the present invention. The semiconductor device 100 includes a semiconductor substrate 102, such as a lightly doped semiconductor substrate of a first conductivity type, for example a p⁻ doped semiconductor substrate. The semiconductor substrate 102 also can be a Silicon-On-Insulator (SOI) substrate. A well 104 of a second conductivity type, such as an n-type well, is formed in certain portions of the semiconductor substrate 102 by a diffusion and/or implant process.

The semiconductor substrate 102 also has a number of shallow trench isolations (STIs) 106 to isolate the transistors to be manufactured in and on the semiconductor substrate 102. The number of STIs 106 is provided by forming trenches, such as by etching, in the semiconductor substrate 102. The trenches are then filled with an insulating material after forming a liner to form the number of STIs 106. The surface may then be processed using a chemical mechanical polishing (CMP) process which stops on the surface of the semiconductor substrate 102 so that the upper surfaces of the number of STIs 106 are substantially coplanar with the upper surface of the semiconductor substrate 102. A first insulating layer of oxide is then formed over the surface of the semiconductor substrate 102. Alternatively, high-k dielectric materials, such as hafnium/aluminum/oxide (HfAlO), which have a higher dielectric constant (k value) compared to silicon dioxide may be used to form the insulating layer.

A gate 108 is provided by forming a polysilicon layer or a metal layer (to form a metal gate) over the first insulating layer. A second insulating layer is formed over the polysilicon layer or the metal layer. The second insulating layer can consist of more than one layer of material, such as by forming a silicon dioxide ($SiO_2$) layer followed by the forming of a silicon nitride (SiN) layer. A photoresist layer is deposited on the second insulating layer, patterned, and processed to form a gate mask. The gate mask is processed to form the gate 108 by etching the second insulating layer, the polysilicon layer or metal layer, and the first insulating layer. The unetched portion of the first insulating layer beneath the gate 108 forms a gate dielectric 110. The unetched portion of the second insulating layer forms a hard mask 112 over the gate 108. An insulating spacer 114 is formed around the gate dielectric 110, the gate 108, and the hard mask 112. A number of source/drain regions 116 thus is formed between the insulating spacer 114 and the number of STIs 106 at the planarized surface of the semiconductor substrate 102. The number of source/drain regions 116 may or may not be doped with source/drain dopants at this step.

Figure 2:
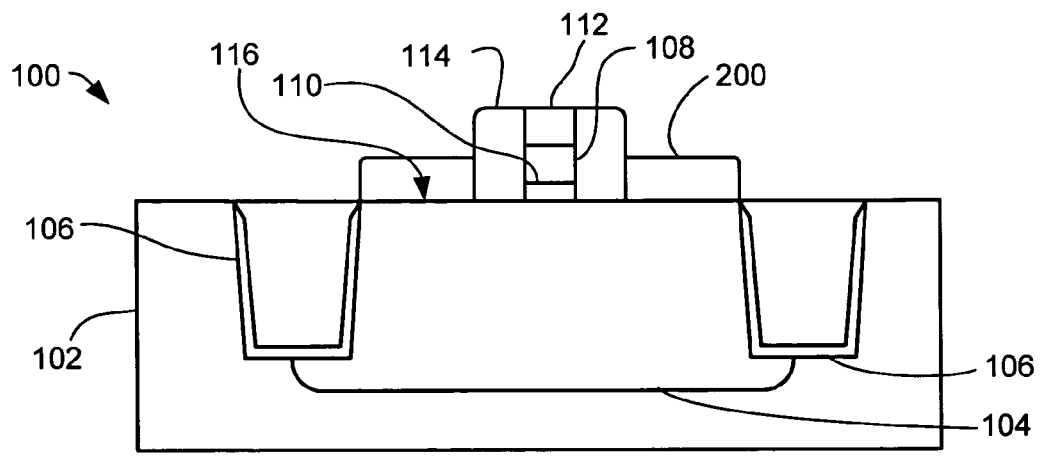
FIG. 2 is the structure of FIG. 1 after formation of a layer containing a strain-inducing element over source/drain regions.

Referring now to FIG. 2, therein is shown the structure of FIG. 1 after formation of a layer 200 containing a strain-inducing element.

As used herein a strain-inducing element is an element that has an atomic size that is substantially different from the atomic size of the element or elements comprising the semiconductor substrate 102. A strain-inducing element creates a strain in the channel of an MOS transistor in the semiconductor substrate 102 when the strain-inducing element is driven into the source/drain regions 116 of the semiconductor substrate 102 adjacent to the channel of the MOS transistor. It has been discovered that atoms with an atomic size difference greater than or equal to about 2% of the atomic size of the substrate atoms, and preferably with an atomic size difference greater than or equal to about 4% of the substrate atoms, can be used to create a strain in the channel of an MOS transistor.

For example, if the semiconductor substrate 102 is Si, the layer 200 preferably is at least one of a Ge layer, a silicon germanium (SiGe) layer, a silicon-germanium-carbon (SiGeC) layer, and combinations thereof, over the source/drain regions 116, which both contain Ge as a strain-inducing element. The SiGeC layer also contains carbon as a strain-inducing element. The atomic size of Ge and C is sufficiently different than the atomic size of Si to strain the channel of a transistor manufactured in accordance with the present invention.

The layer 200 is formed by selective epitaxial growth of the layer 200 containing the strain-inducing element over the source/drain regions 116. The layer 200 containing the strain-inducing element has a thickness between about 5 nm and about 1000 nm, and preferably between about 50 nm and about 200 nm. The layer 200 containing a strain-inducing element can be doped in situ to facilitate the formation of source/drain extensions by subsequent diffusion of the dopant along with the Ge or C atoms as the case may be into the source/drain regions 116 thereby avoiding the need for an ion implantation process to form the source/drain extensions. In the case where the source/drain dopants are already introduced into the source/drain region 116, the presence of dopant atoms in the layer 200 is optional.

Figure 3:
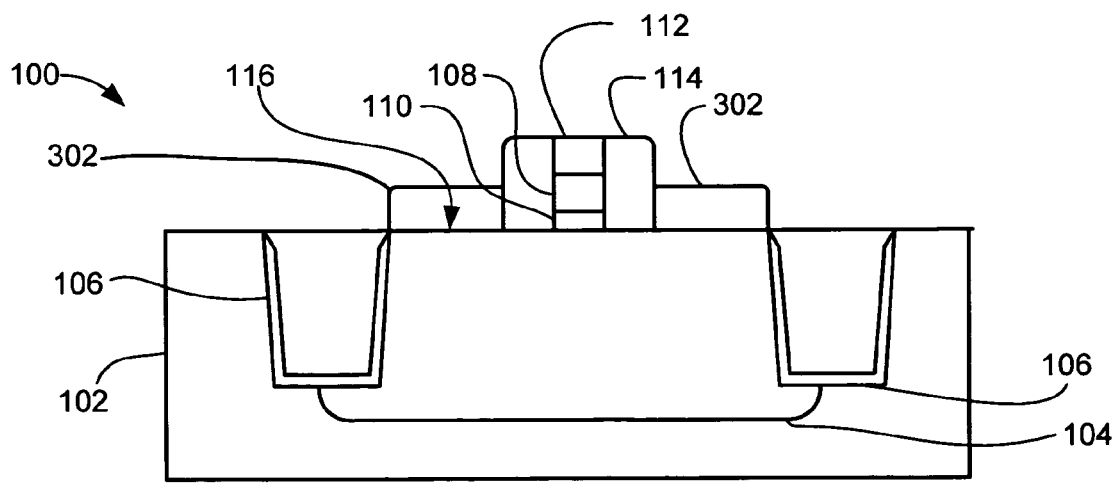
FIG. 3 is the structure of FIG. 2 after driving the strain-inducing element into the source/drain regions.

Referring now to FIG. 3, therein is shown the structure of FIG. 2 after driving the strain-inducing element into the source/drain regions 116. The strain-inducing element is driven into the source/drain regions 116 by oxidizing the layer 200 containing a strain-inducing element shown in FIG. 2. The oxidation of the layer 200 drives the strain-inducing element into the source/drain regions 116. The oxidation occurs at a temperature of about 400° C. to about 1200° C., and preferably in a temperature range of about 800° C. to about 1000° C., to oxidize the layer 200 and drive the strain-inducing element into the source/drain regions 116. An oxide 302 is formed from the layer 200 as a result of the oxidation process. The layer 200 need not be fully oxidized, which results in the source/drain regions being raised slightly above the upper surface of the semiconductor substrate 102. This will result in a lower series resistance for the MOS transistor.

Alternatively, the process that drives the strain-inducing element into the source/drain regions 116 is a nitridation process or an oxygen-plasma treatment process. A subsequent temperature step of between 700° C. and 1000° C., for example, annealing in nitrogen ambient, may be required for further diffusion or re-distribution of the strain-inducing element in the number of source drain regions 116.

Figure 4:
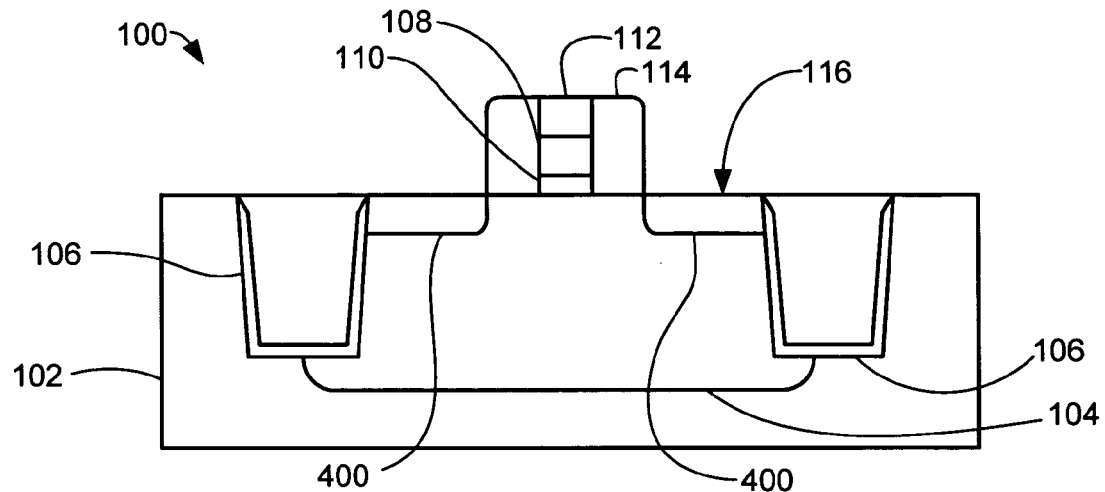
FIG. 4 is the structure of FIG. 3 after removal of an oxide over the source/drain regions layer and any of the remaining strain-inducing element that was not driven into the source/drain regions.

Referring now to FIG. 4, therein is shown the structure of FIG. 3 after removal of the oxide 302 over the source/drain regions 116. The oxide 302 is selectively removed, such as by etching, for example, using a dilute hydrofluoric acid (HF). Accordingly, the source/drain regions 116 are substantially unetched. A number of source/drains 400 then is formed in the source/drain regions 116 using conventional CMOS doping and annealing processes. The source/drain ion implantation can be done after formation of additional insulating spacers to further separate the source and drain junctions. The hard mask 112 also needs to be removed. This hard mask can be removed directly before or after the source/drain implant step.

Figure 5:
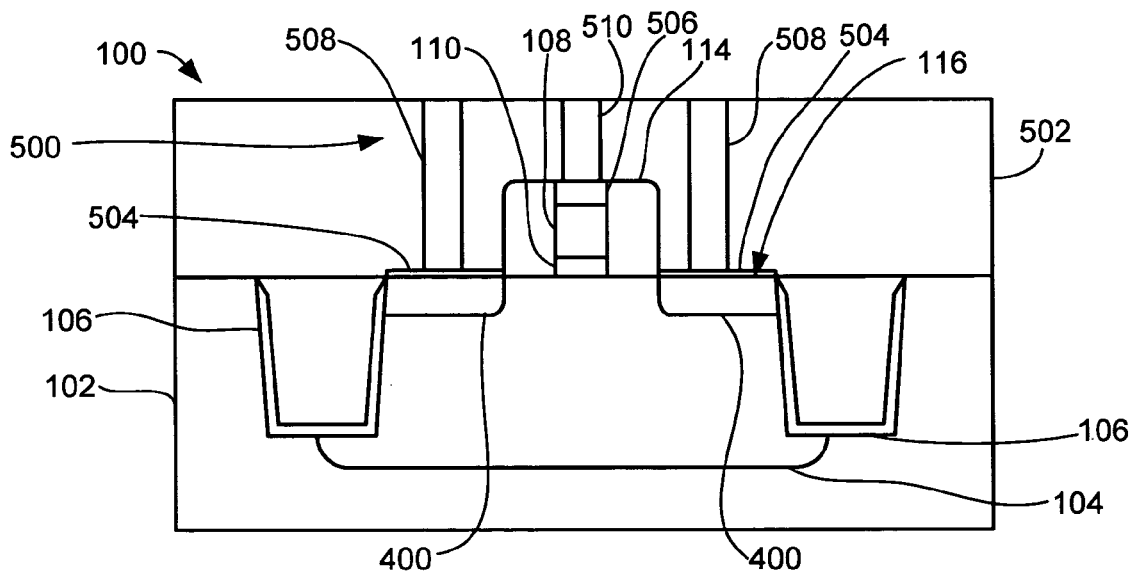
FIG. 5 is the structure of FIG. 4 after formation of a number of contacts in a dielectric layer.

Referring now to FIG. 5, therein is shown the structure of FIG. 4 after formation of a number of contacts 500 in an interlevel dielectric (ILD) layer 502. The structures of the transistors that will serve as locations for the contacts may have a silicide formed over them in a conventional manner.

Accordingly, the number of source/drains 400 has a first silicide layer 504 formed over them. The gate 108 has a second silicide layer 506 formed over it. The ILD layer 502 is formed over the structure and processed using a CMP process to planarize the ILD layer 502. The ILD layer 502 has holes formed through the ILD layer 502 over the various contact areas. The holes in the ILD layer 502 are filled with a suitable conductive material, such as tungsten, to form the number of contacts 500.

Thus, a number of source/drain contacts 508 is formed through the ILD layer 502 in contact with the first silicide layer 504 over the number of source/drains 400. A gate contact 510 is formed through the ILD layer 502 in contact with the second silicide layer 506 over the gate 108. It will be apparent from a reading of this description that FIG. 5 is for illustration purposes only. The gate contact 510 may not be in the same plane as the plane containing the source and drain contacts.

Figure 6:
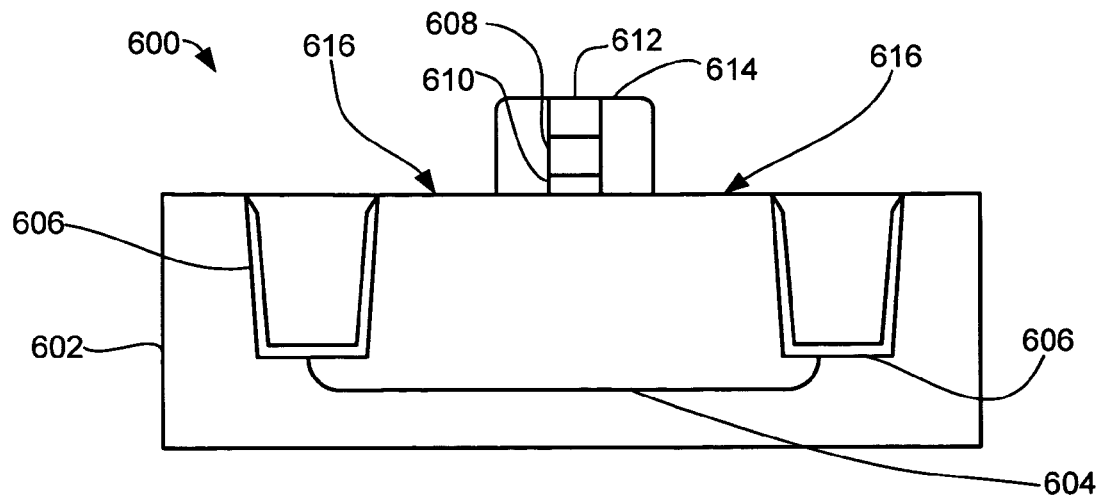
FIG. 6 is a cross-sectional view of a semiconductor at an intermediate stage of manufacture in accordance with another embodiment of the present invention.

Referring now to FIG. 6 therein is shown a cross-sectional view of a semiconductor device 600 at an intermediate stage of manufacture in accordance with another embodiment of the present invention. The semiconductor device 600 includes a semiconductor substrate 602, such as a lightly doped semiconductor substrate of a first conductivity type, for example a p⁻ doped semiconductor substrate. The semiconductor substrate 602 also can be a Silicon-On-Insulator (SOI) substrate. A well 604 of a second conductivity type, such as an n-type well, is formed in certain portions of the semiconductor substrate 602 by a diffusion and/or implant process.

The semiconductor substrate 602 also has a number of shallow trench isolations (STIs) 606 to isolate the transistors to be manufactured in and on the semiconductor substrate 602. The number of STIs 606 is provided by forming trenches, such as by etching, in the semiconductor substrate 602. The trenches are then filled with an insulating material after forming a liner to form the number of (STIs) 606. The surface may then be processed using a chemical mechanical polishing (CMP) process which stops on the surface of the semiconductor substrate 602 so that the upper surfaces of the number of STIs 606 are substantially coplanar with the upper surface of the semiconductor substrate 602. A first insulating layer of oxide is then formed over the surface of the semiconductor substrate 102. Alternatively, high-k dielectric materials, such as hafnium/aluminum/oxide (HfAlO), which have a higher dielectric constant (k value) compared to silicon dioxide may be used.

A gate 608 is provided by forming a polysilicon layer or a metal layer (to form a metal gate) over the first insulating layer. A second insulating layer is formed over the polysilicon layer or the metal layer. The second insulating layer can consist of more than one layer of material, such as by forming a silicon dioxide ($SiO_2$) layer followed by the forming of a silicon nitride (SiN) layer. A photoresist layer is deposited on the second insulating layer. The photoresist layer is patterned, and processed to form a gate mask. The gate mask is processed to form the gate 608 by etching the second insulating layer, the polysilicon layer or the metal layer, and the first insulating layer. The unetched portion of the first insulating layer beneath the gate 608 forms a gate dielectric 610. The unetched portion of the second insulating layer forms a hard mask 612 over the gate 608. An insulating spacer 614 is formed around the gate dielectric 610, the gate 608, and the hard mask 612. A number of source/drain regions 616 is thus formed between the insulating spacer 614 and the number of STIs 606 at the surface of the semiconductor substrate 602. The number of source/drain regions 616 may or may not be doped with source/drain dopants at this step.

Figure 7:
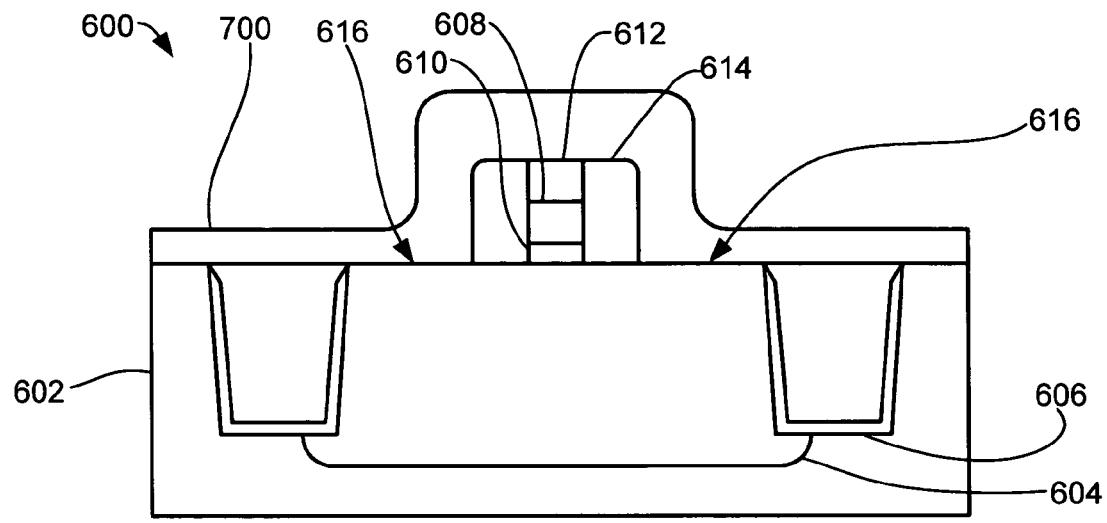
FIG. 7 is the structure of FIG. 6 after formation of a layer containing a strain-inducing element.

Referring now to FIG. 7, therein is shown the structure of FIG. 6 after formation of a layer 700 containing a strain-inducing element such as at least one of a Ge layer, a SiGe layer, a SiGeC layer, and combinations thereof, which contain Ge as a strain-inducing element, over the number of source/drain regions 616. The SiGeC layer also contains C as a strain-inducing element. The layer 700 containing a strain-inducing element is formed by deposition over the structure of FIG. 6. The layer 700 has a thickness between about 5 nm and about 1000 nm, and preferably between about 50 nm and about 200 nm Referring now to FIG. 8, therein is shown the structure of FIG. 7 after driving the strain-inducing element into the number of source/drain regions 616. The strain-inducing element is driven into the number of source/drain regions 616 by oxidizing the layer 700 containing a strain-inducing element. The oxidation of the layer 700 containing a strain-inducing element drives the strain-inducing element into the number of source/drain regions 616.

The oxidation occurs at a temperature of between about 400° C. to about 1200° C., and preferably between about 800° C. to about 1000° C. to oxidize the layer 700 containing a strain-inducing element and drive the strain-inducing element into the number of source/drain regions 616. An oxide 802 is formed from the layer 700 containing a strain-inducing element as a result of the oxidation process. Alternatively, the process that drives the strain-inducing element into the number of source/drain regions 616 can be a reaction such as a nitridation process or an oxygen plasma treatment. A subsequent temperature step of between about 700° C. and about 1000° C., for example, annealing in nitrogen ambient, may be required for further diffusion or re-distribution of the strain inducing element in the number of source drain regions 616.

Figure 8:
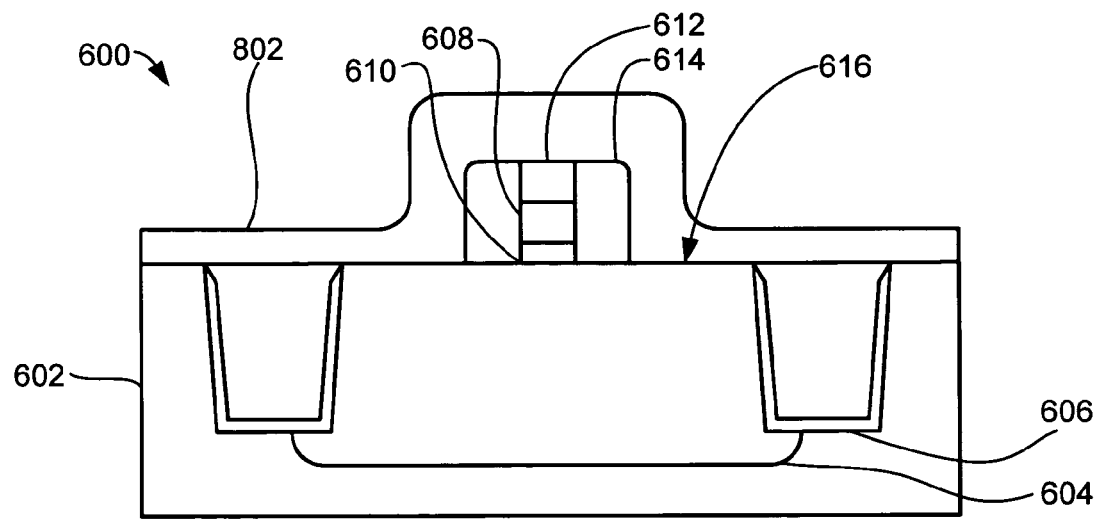
FIG. 8 is the structure of FIG. 7 after driving the strain-inducing element.
Figure 9:
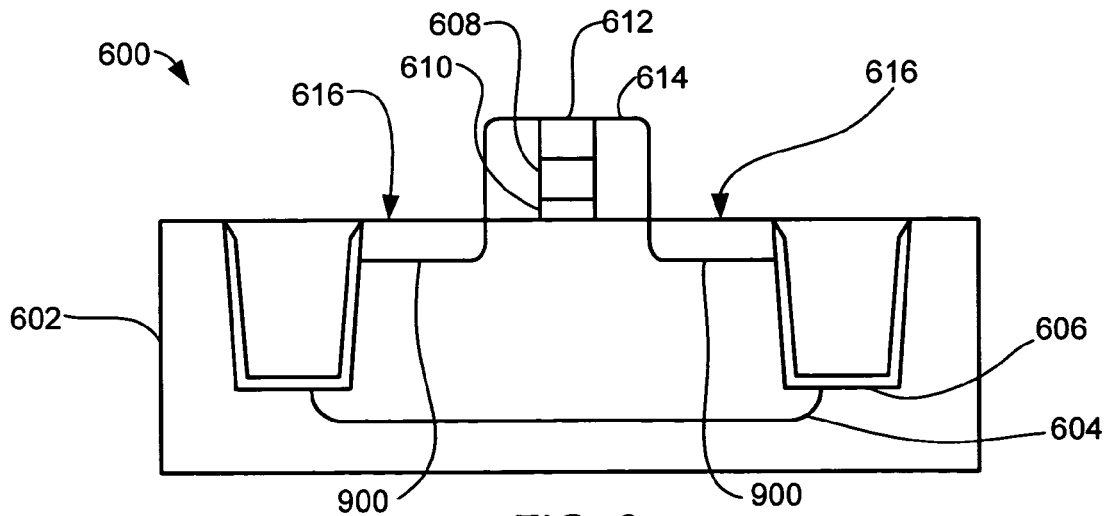
FIG. 9 is the structure of FIG. 8 after removal of an oxidation layer and any of the remaining strain-inducing element that was not driven into the source/drain regions.

Referring now to FIG. 9, therein is shown the structure of FIG. 8 after removal of the oxide 802 over the source/drain regions 616. The oxide 802 is removed, such as by etching the oxide 802. In the case of Ge being the strain-inducing element for example, a hydrofluoric acid (HF) clean is used to remove the oxide layer. Subsequently, an etchant comprising hydrogen peroxide $H_2O_2$ (e.g. 31%) may be used to remove any layer that has a Ge content greater than about 65% across the surface of the semiconductor substrate 602. Alternatively, hot water at about 90° C. can be used to remove any layer having a Ge content of greater than about 65% across the surface of the semiconductor substrate 602. Accordingly, the source/drain regions 616 are substantially unetched. This cleaning step is not required if there is no strain inducing element from layer 700 remaining on top of the hard mask 612 or on top of insulating spacer 614. A number of source/drains 900 is then formed in the number of source/drain regions 616 using conventional CMOS doping and annealing processes. The source/drain ion implantation can be performed after formation of additional insulating spacers to further separate the source and drain junctions. The hard mask 612 also needs to be removed. The hard mask 612 can be removed directly before or after the source/drain implantation step.

Figure 10:
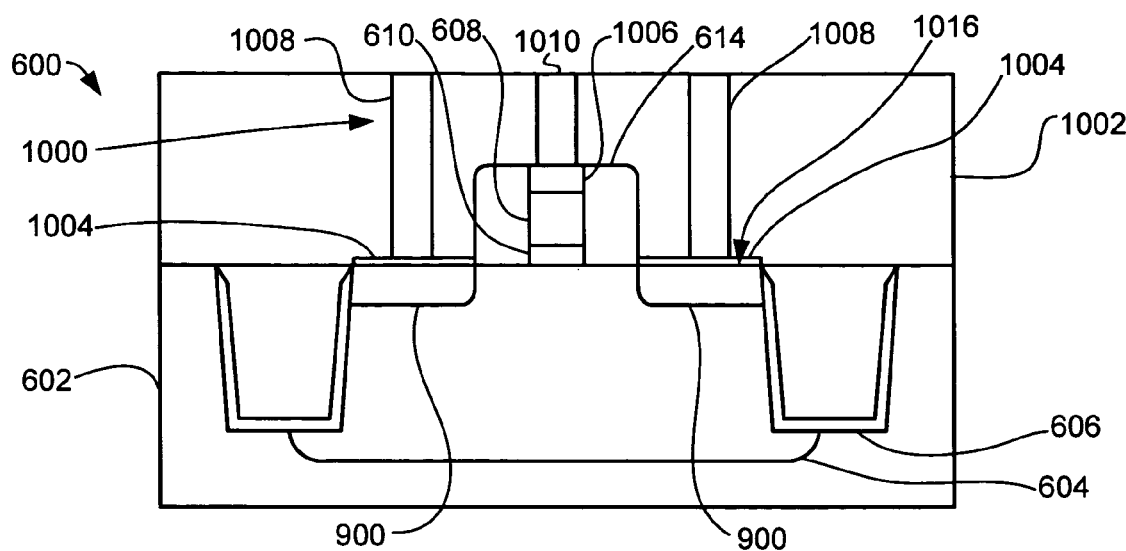
FIG. 10 is the structure of FIG. 9 after formation of a number of contacts in a dielectric layer.

Referring now to FIG. 10, therein is shown the structure of FIG. 9 after formation of a number of contacts 1000 in an interlevel dielectric (ILD) layer 1002. The structures of the transistors that will serve as locations for the contacts may have a silicide formed over them in a conventional manner.

Accordingly, the number of source/drains 900 has a first silicide layer 1004 formed over them. The gate 608 has a second silicide layer 1006 formed over it. The ILD layer 1002 is formed over the structure and processed using a CMP process to planarize the ILD layer 1002. The ILD layer 1002 has holes formed through the ILD layer 1002 over the various contact areas. The holes in the ILD layer 1002 are filled with a suitable conductive material, such as tungsten, to form the number of contacts 1000.

Thus, a number of source/drain contacts 1008 is formed through the ILD layer 1002 in contact with the first silicide layer 1004 over the source/drains 900. A gate contact 1010 is formed through the ILD layer 1002 in contact with the second silicide layer 1006 over the gate 608. It will be apparent from a reading of this description that FIG. 10 is for illustration purposes only. The gate contact 1010 may not be in the same plane as the plane containing the number of source and drain contacts 1008.

Figure 11:
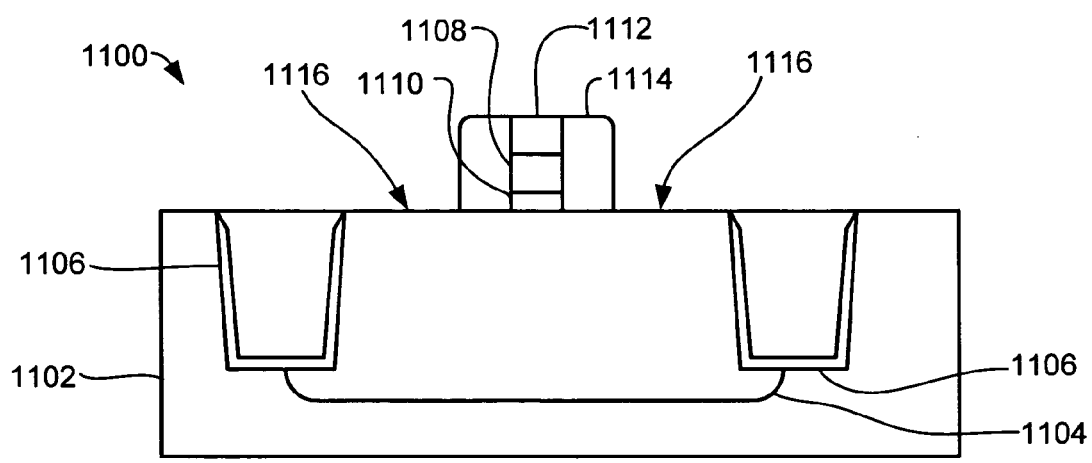
FIG. 11 is a cross-sectional view of a semiconductor at an intermediate stage of manufacture in accordance with another embodiment of the present invention.

Referring now to FIG. 11, therein is shown a cross-sectional view of a semiconductor device 1100 at an intermediate stage of manufacture in accordance with another embodiment of the present invention. The semiconductor device 1100 includes a semiconductor substrate 1102, such as a lightly doped semiconductor substrate of a first conductivity type, for example a p⁻ doped semiconductor substrate. The semiconductor substrate 1102 also can be a Silicon-On-Insulator (SOI) substrate. A well 1104 of a second conductivity type, such as an n-type well, is formed in certain portions of the semiconductor substrate 1102 by a diffusion and/or implant process.

The semiconductor substrate 1102 also has a number of shallow trench isolations (STIs) 1106 to isolate the transistors to be manufactured in and on the semiconductor substrate 1102. The number of STIs 1106 is provided by forming trenches, such as by etching, in the semiconductor substrate 1102. The trenches are then filled with an insulating material after forming a liner to form the number of (STIs) 1106. The surface may then be processed using a chemical mechanical polishing (CMP) process which stops on the surface of the semiconductor substrate 1102 so that the upper surfaces of the number of STIs 1106 are substantially coplanar with the upper surface of the semiconductor substrate 1102. A first insulating layer of oxide is then formed over the surface of the semiconductor substrate 102. Alternatively, high-k dielectric materials, such as hafnium/aluminum/oxide (HfAlO), which have a higher dielectric constant (k value) compared to silicon dioxide may be used.

A gate 1108 is provided by forming a polysilicon layer or a metal layer (to form a metal gate) over the first insulating layer. A second insulating layer is formed over the polysilicon layer or the metal layer. The second insulating layer can consist of more than one layer of material, such as by forming a silicon dioxide (SiO$_2$) layer followed by the forming of a silicon nitride (SiN) layer. A photoresist layer is deposited on the second insulating layer, patterned, and processed to form a gate mask. The gate mask is processed to form the gate 1108 by etching the second insulating layer, the polysilicon layer or the metal layer, and the first insulating layer. The unetched portion of the first insulating layer beneath the gate 1108 forms a gate dielectric 1110. The unetched portion of the second insulating layer forms a hard mask 1112 over the gate 1108. An insulating spacer 1114 is formed around the gate dielectric 1110, the gate 1108, and the hard mask 1112. A number of source/drain regions 1116 is thus formed between the insulating spacer 1114 and the number of STIs 1106 at the surface of the semiconductor substrate 1102. The number of source/drain regions 1116 may or may not be doped with source/drain dopants at this step.

Figure 12:
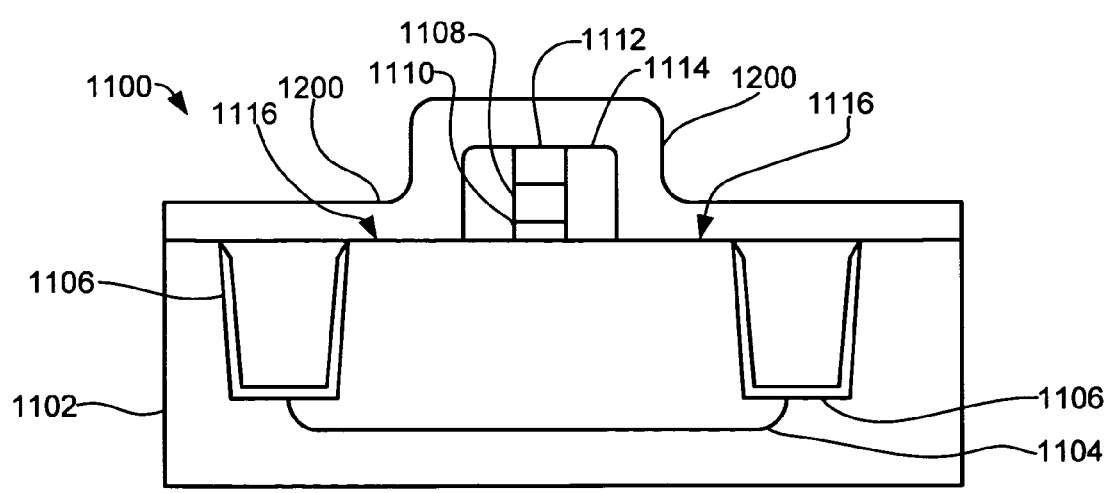
FIG. 12 is the structure of FIG. 11 after formation of a layer containing a strain-inducing element.

Referring now to FIG. 12, therein is shown the structure of FIG. 11 after formation of a layer 1200 containing a strain-inducing element such as at least on of a Ge layer, a SiGe layer, a SiGeC layer, and combinations thereof, which contain Ge as a strain-inducing element, over the structure shown in FIG. 11. The SiGeC layer also contains C as a strain-inducing element. The layer 1200 containing a strain-inducing element is formed by deposition over the structure of FIG. 11. The layer 1200 containing a strain-inducing element has a thickness between about 5 nm and about 1000 nm, and preferably between about 50 nm and about 200 nm.

Figure 13:
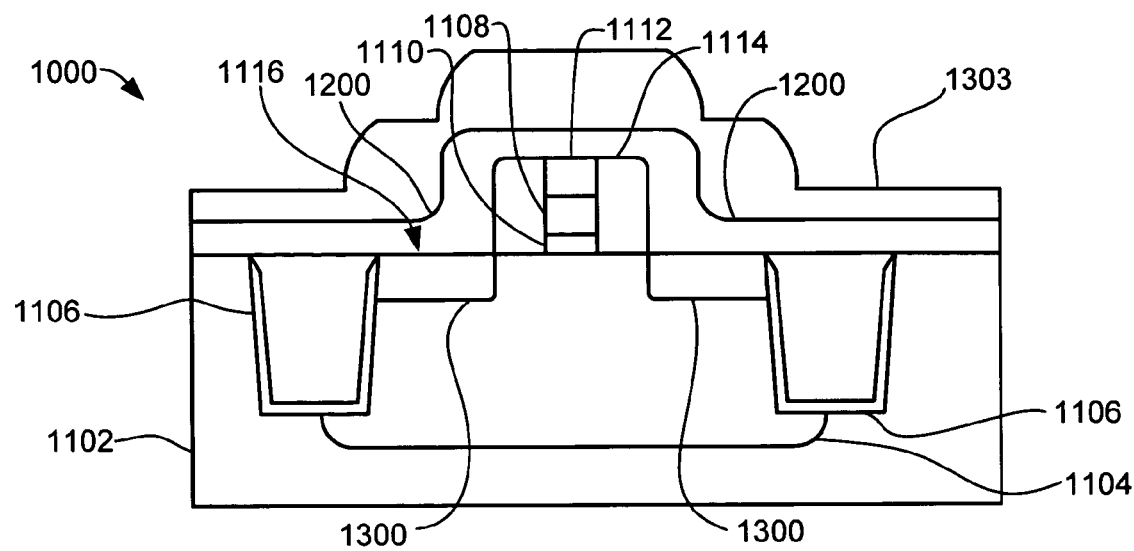
FIG. 13 is the structure of FIG. 12 after formation of a cap layer.

Referring now to FIG. 13, therein is shown the structure of FIG. 12 after diffusing the strain-inducing element into the source/drain regions 1116. A cap layer 1303 is formed over the structure of FIG. 12 by depositing an insulating material, such as a nitride or an oxide. The strain-inducing element is driven into the number of source/drain regions 1116 by an annealing process. The annealing of the layer 1200 drives the strain-inducing element from the layer 1200 containing a strain-inducing element into the number of source/drain regions 1116. The cap layer 1303 prevents out-diffusion of the strain-inducing element as well as other dopants, if present, during the annealing process.

Figure 14:
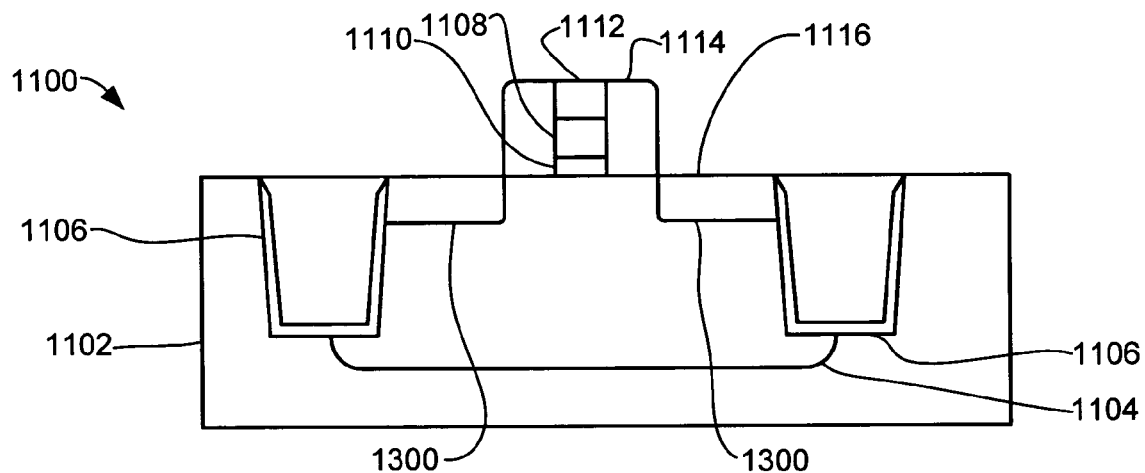
FIG. 14 is the structure of FIG. 13 after driving the strain-inducing element and removal of the cap layer and any of the remaining strain-inducing element that was not driven into the source/drain regions.

Referring now to FIG. 14, therein is shown the structure of FIG. 13 after removal of the cap layer 1303 and any of the layer 1200 remaining over the entire structure. The cap layer 1303 is removed, such as by etching using a suitable etchant depending upon the insulating material used to form the cap layer 1303. The remaining portion of layer 1200 containing a strain-inducing element, if any, is removed, such as by etching. For example, an etchant of H$_2$O$_2$ (e.g. 31%) has been found to selectively etch the layer 1200 containing a strain-inducing element that has a Ge content greater than about 65%. Alternatively, hot water at about 90° C. can also be used to remove the oxide having a Ge content of greater than about 65%. Accordingly, the number of source/drain regions 1116 is substantially unetched.

A number of source/drains 1300 is then formed in the number of source/drain regions 1116 using conventional CMOS doping and annealing processes. The source/drain ion implantation can be done after formation of additional insulating spacers to further separate the source and drain junctions. The hard mask 1112 also needs to be removed. The hard mask 1112 can be removed directly before or after the source/drain implant step.

Figure 15:
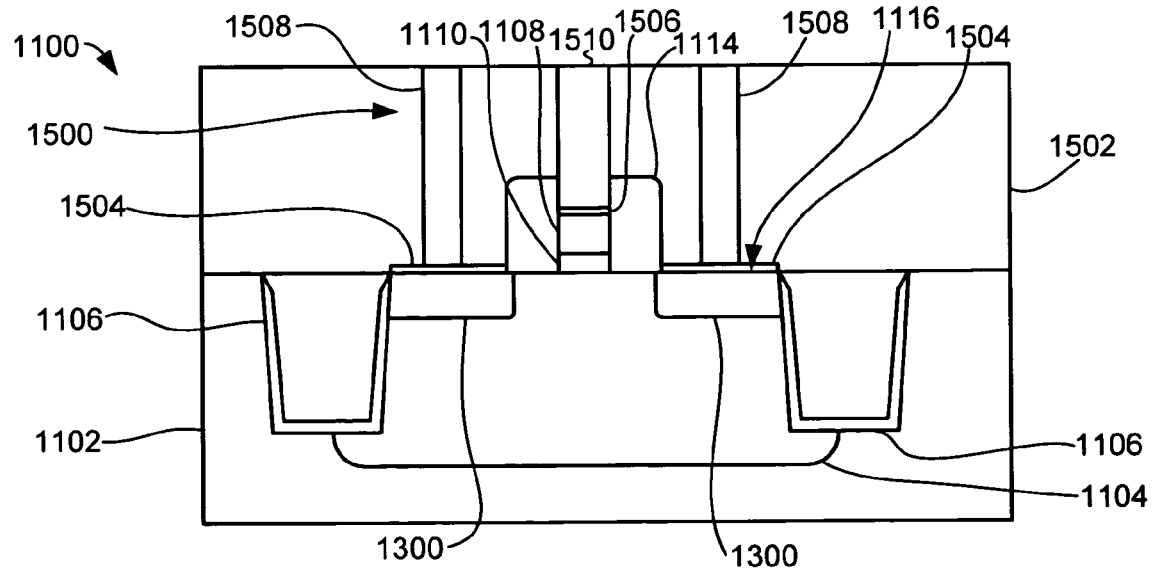
FIG. 15 is the structure of FIG. 14 after formation of a number of contacts in a dielectric layer.

Referring now to FIG. 15, therein is shown the structure of FIG. 14 after formation of a number of contacts 1500 in an interlevel dielectric (ILD) layer 1502. The structures of the transistors that will serve as locations for the contacts may have a silicide formed over them in a conventional manner.

Accordingly, the source/drains 1300 have a first silicide layer 1504 formed over them. The gate 1108 has a second silicide layer 1506 formed over it. The ILD layer 1502 is formed over the structure and processed using a CMP process to planarize the ILD layer 1502. The ILD layer 1502 has holes formed through the ILD layer 1502 over the various contact areas. The holes in the ILD layer 1502 are filled with a suitable conductive material, such as tungsten, to form the number of contacts 1500.

Thus, a number of source/drain contacts 1508 is formed through the ILD layer 1502 in contact with the first silicide layer 1504 over the source/drains 1300. A gate contact 1510 is formed through the ILD layer 1502 in contact with the second silicide layer 1506 over the gate 1108. It will be apparent from a reading of this description that FIG. 15 is for illustration purposes only. The gate contact 1010 may not be in the same plane as the plane containing the number of source and drain contacts 1508.

Figure 16:
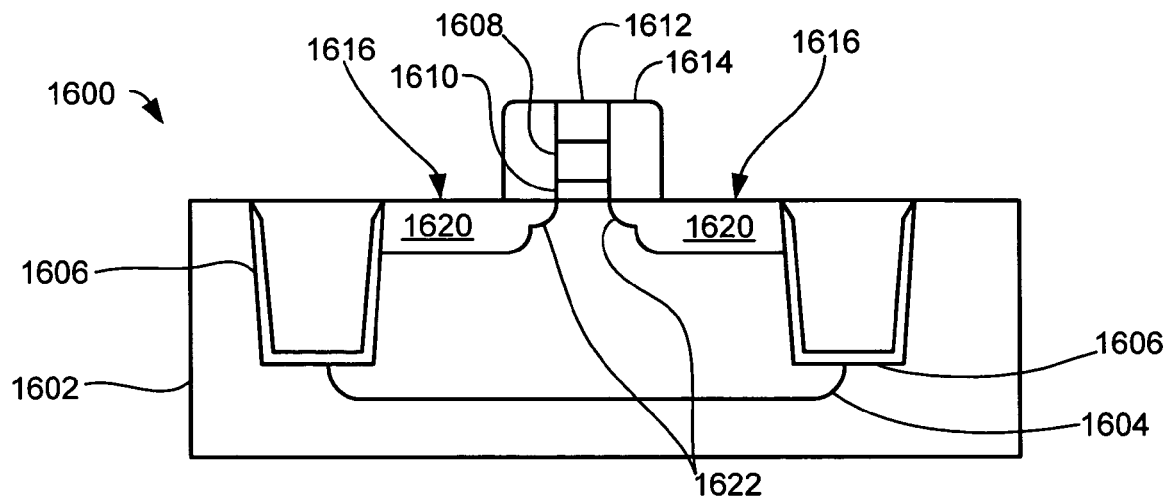
FIG. 16 is a cross-sectional view of a semiconductor having source/drains at an intermediate stage of manufacture in accordance with another embodiment of the present invention.

Referring now to FIG. 16, therein is shown a cross-sectional view of a semiconductor device 1600 at an intermediate stage of manufacture in accordance with another embodiment of the present invention. The semiconductor device 1600 includes a semiconductor substrate 1602, such as a lightly doped semiconductor substrate of a first conductivity type, for example a p$^-$ doped semiconductor substrate. The semiconductor substrate 1602 also can be a Silicon-On-Insulator (SOI) substrate. A well 1604 of a second conductivity type, such as an n-type well, is formed in certain portions of the semiconductor substrate 1602 by a diffusion and/or implant process.

The semiconductor substrate 1602 also has a number of shallow trench isolations (STIs) 1606 to isolate the transistors to be manufactured in and on the semiconductor substrate 1602. The number of STIs 1606 is provided by forming trenches, such as by etching, in the semiconductor substrate 1602. The trenches are then filled with an insulating material after forming a liner to form the number of (STIs) 1606. The surface may then be processed using a chemical mechanical polishing (CMP) process which stops on the surface of the semiconductor substrate 1602 so that the upper surfaces of the number of STIs 1606 are substantially coplanar with the upper surface of the semiconductor substrate 1602. A first insulating layer of oxide is then formed over the surface of the semiconductor substrate 1602. Alternatively, high-k dielectric materials, such as hafnium/aluminum/oxide (HfAlO), which have a higher dielectric constant (k value) compared to silicon dioxide may be used.

A gate 1608 is provided by forming a polysilicon layer or a metal layer (to form a metal gate) over the first insulating layer. A second insulating layer is formed over the polysilicon layer or the metal layer. The second insulating layer can consist of more than one layer of material, such as by forming a silicon dioxide (SiO$_2$) layer followed by the forming of a silicon nitride (SiN) layer. A photoresist layer is deposited on the second insulating layer, patterned, and processed to form a gate mask. The gate mask is processed to form the gate 1608 by etching the second insulating layer, the polysilicon layer or the metal layer, and the first insulating layer. The unetched portion of the first insulating layer beneath the gate 1608 forms a gate dielectric 1610. The unetched portion of the second insulating layer forms a hard mask 1612 over the gate 1608. An insulating spacer 1614 is formed around the gate dielectric 1610, the gate 1608, and the hard mask 1612. A number of source/drain regions 1616 is thus formed between the insulating spacer 1614 and the number of STIs 1606 at the surface of the semiconductor substrate 1602.

A number of source/drains 1620 is formed by diffusing a suitable dopant into the number of source/drain regions 1616 in accordance with standard semiconductor manufacturing techniques including implanting the source/drain regions 1116 with an appropriate dopant and performing an annealing process. The number of source/drains 1620 also may include a number of source/drain extension regions 1622 using conventional processing techniques after the formation of the gate 1608.

Figure 17:
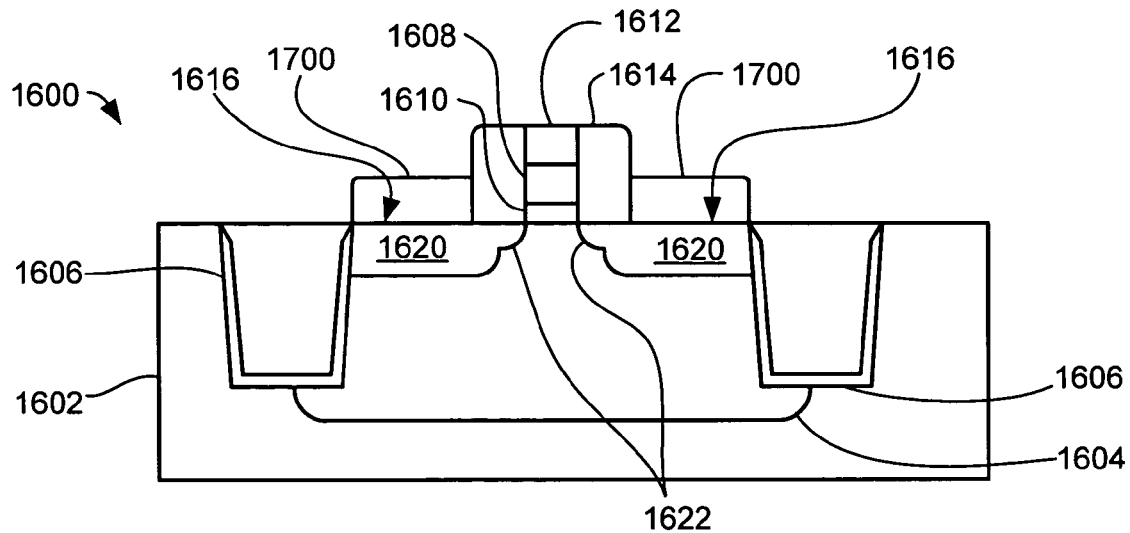
FIG. 17 is the structure of FIG. 16 after formation of a layer containing a strain-inducing element over the source/drains.

Referring now to FIG. 17, therein is shown the structure of FIG. 16 after formation of a layer 1700 containing a strain-inducing element, such as at least one of a Ge layer, a SiGe layer, a SiGeC layer, and combinations thereof, which contain Ge as a strain-inducing element, over the number of source/drain regions 1616. The SiGeC layer also contains C as a strain-inducing element. The layer 1700 containing a strain-inducing element is formed by deposition of the layer over the structure of FIG. 16, or by selective epitaxial growth of the layer containing a strain-inducing element over the number of source/drain regions 1616. Preferably, the layer 1700 has a thickness between about 5 nm and about 1000 nm, and preferably between about 50 nm and about 200 nm.

Figure 18:
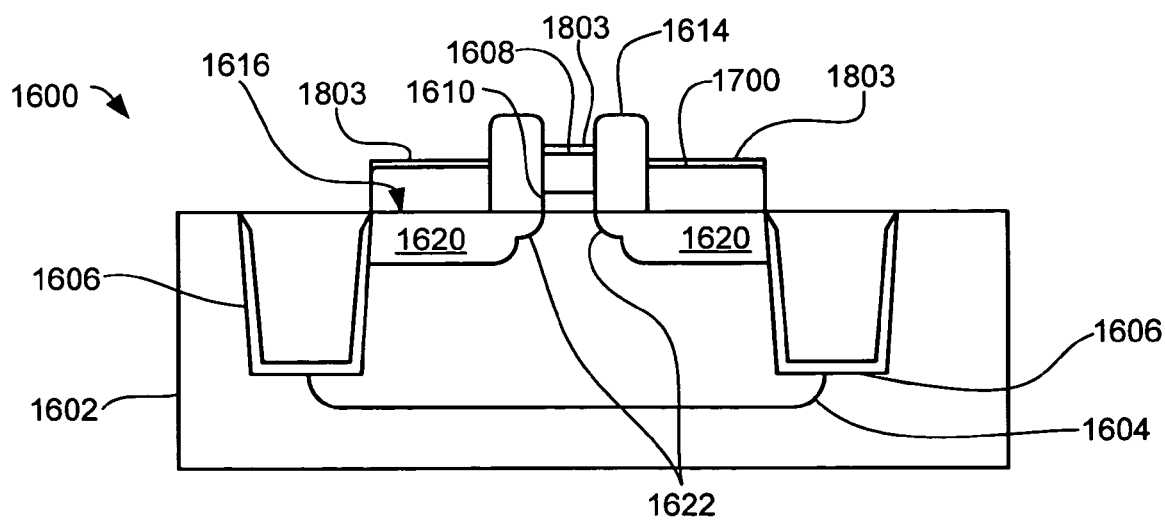
FIG. 18 is the structure of FIG. 17 after formation of a silicide metal layer.

Referring now to FIG. 18, therein is shown the structure of FIG. 17 after driving Ge into the number of source/drain regions 1616. The hard mask 1612 is removed or etched away to uncover the gate 1608. A silicide metal layer 1803 is formed over the layer 1700 containing a strain-inducing element and the gate 1608 by depositing a suitable silicide metal over the layer 1700 containing a strain-inducing element and the gate 1608. Examples of the silicide metal include, but are not limited to, at least one of nickel (Ni), erbium (Er), titanium (Ti), cobalt (Co), dysprosium (Dy), terbium (Tb), tungsten (W), tantalum (Ta), alloys thereof, compounds thereof, and combinations thereof. The strain-inducing element is driven into the number of source/drain regions 1616 by the annealing step in the silicidation process.

Figure 19:
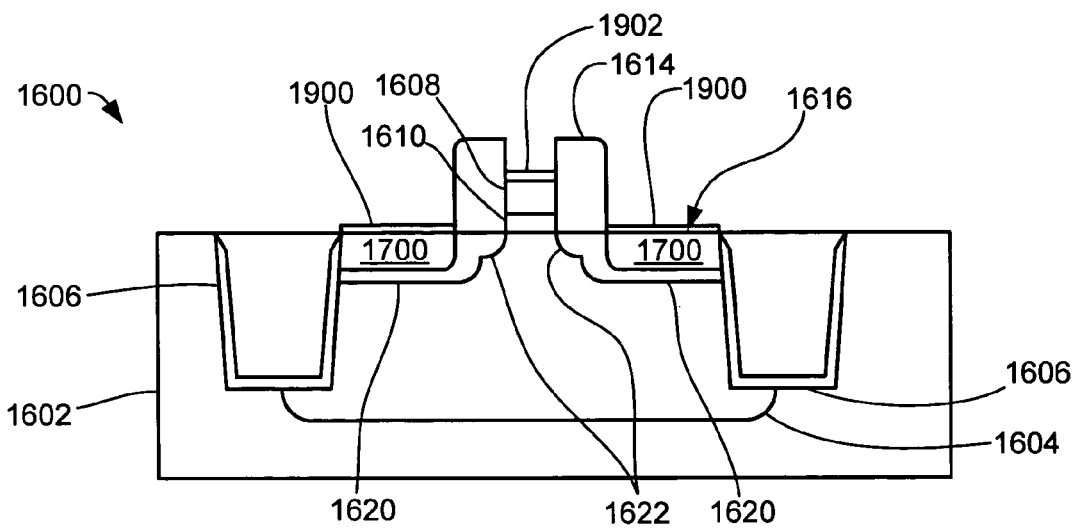
FIG. 19 is the structure of FIG. 18 after a silicidation process.

Referring now to FIG. 19 therein is shown the structure of FIG. 18 after the silicidation process. The silicidation process drives the strain-inducing element into the number of source/drains 1620 and forms a first silicide layer 1900 over the number of source/drain regions 1616 and a second silicide layer 1902 over the gate 1608.

Figure 20:
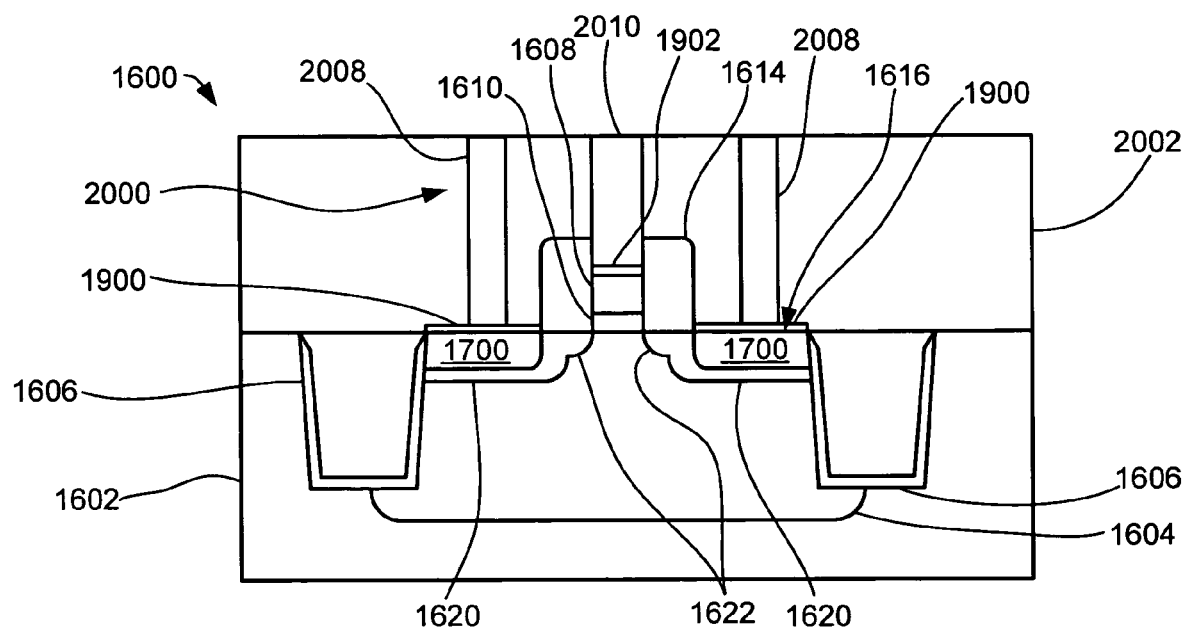
FIG. 20 is the structure of FIG. 19 after formation of a number of contacts in a dielectric layer.

Referring now to FIG. 20, therein is shown the structure of FIG. 19 after formation of a number of contacts 2000 in an interlevel dielectric (ILD) layer 2002.

The ILD layer 2002 is formed over the structure of FIG. 19 and processed using a CMP process to planarize the ILD layer 2002. The ILD layer 2002 has holes formed through the ILD layer 2002 over the various contact areas. The holes in the ILD layer 2002 are filled with a suitable conductive material, such as tungsten, to form the various contacts.

Thus, a number of source/drain contacts 2008 is formed through the ILD layer 2002 in contact with the first silicide layer 1900 over the number of source/drains 1620. A gate contact 2010 is formed through the ILD layer 2002 in contact with the second silicide layer 1902 over the gate 1608.

Figure 21:
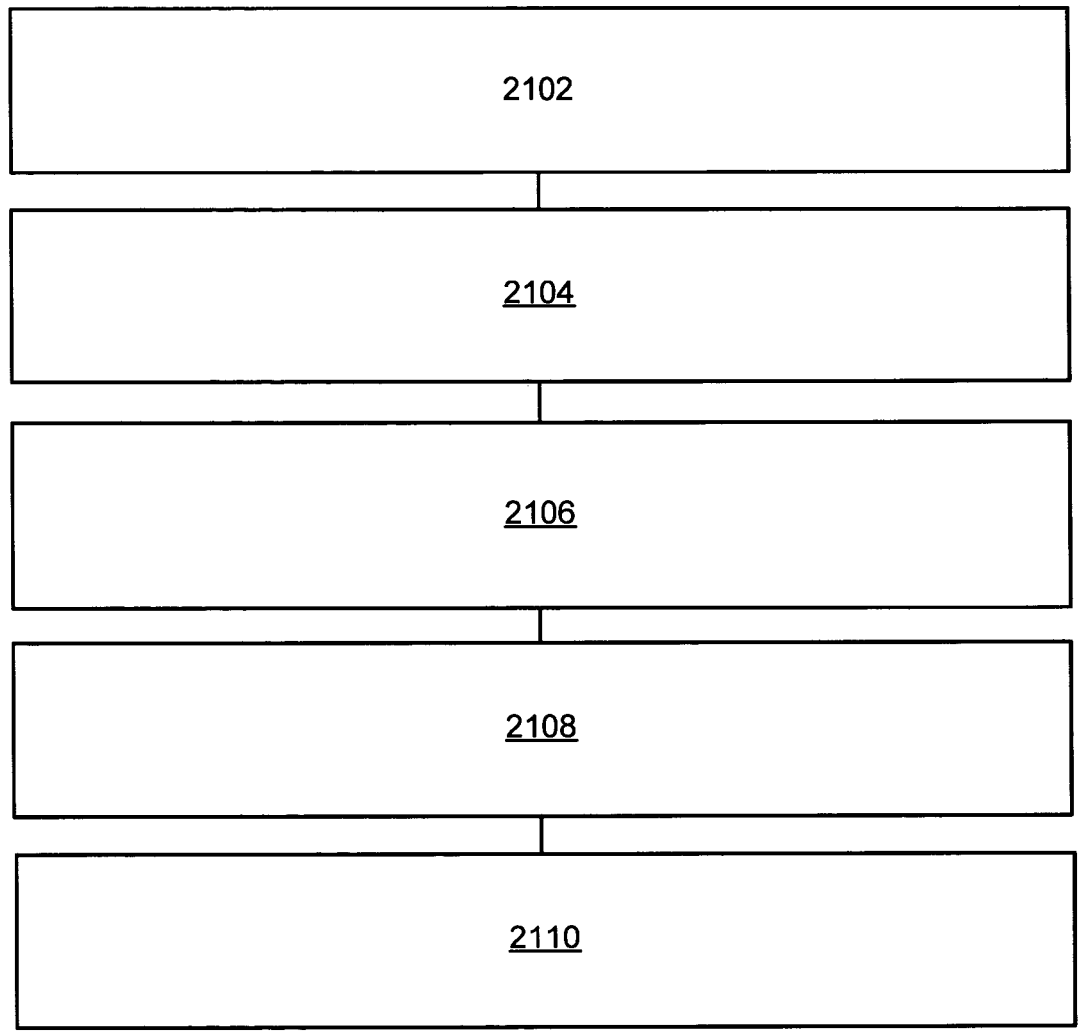
FIG. 21 is a flow chart of a method for manufacturing a semiconductor in accordance with an embodiment of the present invention.

Referring now to FIG. 21, therein is shown a flow chart of a method 2100 for manufacturing a semiconductor in accordance with an embodiment of the present invention. The method 2100 includes providing a semiconductor substrate in a block 2102; forming a gate and a number of source/drain regions on the semiconductor substrate in a block 2104; providing a layer containing a strain-inducing element over the number of source/drain regions in a block 2106; driving the strain-inducing element from the layer containing the strain-inducing element into the number of source/drain regions in a block 2108; and forming a number of source/drains in the source/drain regions in a block 2110.

Thus, it has been discovered that the method and apparatus of the present invention furnish important and heretofore unavailable solutions, capabilities, and functional advantages for manufacturing a semiconductor having a strained channel. The resulting process and configurations are straightforward, economical, uncomplicated, highly versatile, and effective, use conventional technologies, and are thus readily suited for manufacturing semiconductors that are fully compatible with conventional manufacturing processes and technologies.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the scope of the included claims. All matters set forth herein or shown in the accompanying drawings are to be interpreted in an illustrative and non-limiting sense.

The invention claimed is:

1. A method of manufacturing a semiconductor device comprising:
    providing a semiconductor substrate;
    forming a gate and a number of source/drain regions in the semiconductor substrate;
    providing a layer containing a strain-inducing element over the number of source/drain regions;
    driving the strain-inducing element from the layer containing the strain-inducing element into the number of source/drain regions; and
    forming a number of source/drains into the number of source/drain regions.

2. The method of manufacturing a semiconductor device as claimed in claim 1 wherein:
    providing a semiconductor substrate provides a silicon substrate; and
    providing a layer containing a strain-inducing element provides a layer containing at least one of germanium, carbon, mixtures thereof, compounds thereof, and combinations thereof.

3. The method of manufacturing a semiconductor device as claimed in claim 1, wherein the semiconductor substrate comprises at least one of a silicon substrate, a germanium substrate, a semiconductor-on-insulator substrate, a silicon-germanium substrate, and combinations thereof.

4. The method of manufacturing a semiconductor device as claimed in claim 1 wherein providing a layer containing a strain-inducing element provides a layer containing a strain inducing element having an atomic size greater than or equal to 2% larger than the atomic size of the elements in the semiconductor substrate.

5. The method of manufacturing a semiconductor device as claimed in claim 1 wherein providing a layer containing a strain-inducing element provides a layer containing a strain inducing element having an atomic size greater than or equal to 4% larger than the atomic size of the elements in the semiconductor substrate.

6. The method of manufacturing a semiconductor device as claimed in claim 1 wherein the layer containing a strain-inducing element has a thickness in the range of between about 50 nm to about 200 nm.

7. The method of manufacturing a semiconductor device as claimed in claim 1, wherein:
driving the strain-inducing element from the layer containing a strain-inducing element uses at least one of oxidation, annealing, silicidation, nitridation, and a combination thereof.

8. The method of manufacturing a semiconductor device as claimed in claim 1 further comprising:
forming a cap layer over the layer containing a strain-inducing element; and wherein:
driving the strain-inducing element from the layer containing a strain-inducing element uses annealing.

9. The method of manufacturing a semiconductor device as claimed in claim 1 further comprising:
forming a silicide metal layer over the layer containing a strain-inducing element; and
providing a number of contacts through the interlevel dielectric layer provides a number of contacts to the silicide layer over the gate and the number of source/drains.

10. The method of manufacturing a semiconductor device as claimed in claim 1 wherein:
providing a layer containing a strain-inducing element over the number of source/drain regions provides a layer containing a strain-inducing element having dopants therein to form the number of source/drains.

11. The method of manufacturing a semiconductor device as claimed in claim 1 further comprising:
forming an n-well in the substrate; and wherein:
forming a gate on the semiconductor substrate and the number of source/drain regions in the semiconductor substrate forms the gate over the n-well and the number of source/drain regions in the n-well.

12. A method of manufacturing a semiconductor device comprising:
providing a semiconductor substrate;
forming an n-well in the substrate;
forming a gate over the n-well and a number of source/drain regions adjacent the gate in the n-well;
forming an insulating spacer adjacent to the gate;
providing a layer containing a strain-inducing element over the number of source/drain regions;
driving the strain-inducing element from the layer containing a strain-inducing element into the number of source/drain regions;
forming a number of source/-drains into the number of source/drain regions.

13. The method of manufacturing a semiconductor device as claimed in claim 12 wherein:
providing a semiconductor substrate provides a silicon substrate; and
providing a layer containing a strain-inducing element provides a layer containing at least one of germanium, carbon, mixtures thereof, compounds thereof, and combinations thereof.

14. The method of manufacturing a semiconductor device as claimed in claim 12, wherein said semiconductor substrate comprises at least one of a silicon substrate, a germanium substrate, a semiconductor-on-insulator substrate, a silicon-germanium substrate, and combinations thereof.

15. The method of manufacturing a semiconductor device as claimed in claim 12 wherein the strain-inducing element has an atomic size greater than or equal to 2% larger than the atomic size of the substrate elements.

16. The method of manufacturing a semiconductor device as claimed in claim 12 wherein the strain-inducing element has an atomic size greater than or equal to 4% larger than the atomic size of the substrate elements.

17. The method of manufacturing a semiconductor device as claimed in claim 12, wherein:
driving the strain-inducing element from the layer containing a strain-inducing element uses at least one of oxidation, annealing, silicidation, nitridation and a combination thereof.

18. The method of manufacturing a semiconductor device as claimed in claim 12 further comprising:
forming a cap layer over the layer containing a strain-inducing element; and wherein:
driving the strain-inducing element from the layer containing a strain-inducing element uses annealing.

19. The method of manufacturing a semiconductor device as claimed in claim 12 further comprising:
forming a silicide metal layer over the layer containing a strain-inducing element; and
providing a number of contacts through the interlevel dielectric layer provides the number of contacts to the silicide layer over the gate and the number of source/drain regions.

20. The method of manufacturing a semiconductor device as claimed in claim 12 wherein:
providing a layer containing a strain-inducing element over the number of source/drain regions provides a layer containing a strain-inducing element having dopants therein for the number of source/drain regions.

* * * * *